United States Patent [19]
Talbot

[11] Patent Number: 5,483,680
[45] Date of Patent: Jan. 9, 1996

[54] TUNING METHOD FOR AUTOMATIC ANTENNA COUPLERS

[75] Inventor: Robert D. Talbot, Pittsford, N.Y.

[73] Assignee: Harris Corporation, Melbourne, Fla.

[21] Appl. No.: 178,818

[22] Filed: Jan. 7, 1994

[51] Int. Cl.$^6$ .............. H03C 1/52; H01L 5/08; H01Q 1/50
[52] U.S. Cl. .............. 455/107; 455/115; 455/125; 455/129; 333/17.1; 333/17.3; 343/860; 343/861
[58] Field of Search .............. 455/63, 67.1, 67.3, 455/67.4, 107, 115, 121, 124, 123, 125, 129, 289, 126; 333/17.1, 17.3; 343/860, 861; 324/646

[56] References Cited

U.S. PATENT DOCUMENTS

| | | | |
|---|---|---|---|
| 3,601,717 | 8/1971 | Knucken | 333/17.1 |
| 3,778,731 | 12/1973 | Oomen | 333/17.1 |
| 3,794,941 | 2/1974 | Templin | 333/17.1 |
| 3,906,411 | 9/1975 | Lind et al. | 333/32 |
| 3,959,746 | 5/1976 | Straw | 333/17.1 |
| 4,015,223 | 3/1977 | Cheze | 333/17.1 |
| 4,339,827 | 7/1982 | Torres et al. | 455/188 |
| 4,375,051 | 2/1983 | Theall | 333/17.1 |
| 4,493,112 | 1/1985 | Bruene | 455/123 |
| 4,621,242 | 11/1986 | Theall et al. | 333/17.1 |
| 4,636,771 | 1/1987 | Ochs | 340/310 |
| 4,951,009 | 8/1990 | Collins | 333/17.3 |
| 5,117,505 | 5/1992 | Talwar | 455/278.1 |
| 5,125,108 | 6/1992 | Talwar | 455/278.1 |
| 5,187,454 | 2/1993 | Collins et al. | 333/17.3 |

Primary Examiner—Edward F. Urban
Assistant Examiner—Lee Nguyen
Attorney, Agent, or Firm—Rogers & Killeen

[57] ABSTRACT

A method and circuit for detecting and reducing the impedance mismatch between the directional coupler and the antenna of an RF communications system exposed to externally generated RF signals. The impedance mismatch is detected by the quadrature multiplication of the signal passing through a directional coupler in the forward and reverse directions with the detection being enhanced by the use of a forward direction signal substantially devoid of externally generated RF signal components.

8 Claims, 1 Drawing Sheet

TUNING METHOD FOR AUTOMATIC ANTENNA COUPLERS

BACKGROUND OF THE INVENTION

The invention relates to methods and apparatus for detecting an impedance mismatch between a directional coupler and an antenna in a radio frequency (RF) communications system in the presence of externally generated RF signals.

Presently there exist methods and apparatus for detecting impedance mismatch for use in tuning antenna impedance matching circuits. These detecting methods and apparatus are used in RF communication systems where a communications signal is passed through a directional coupler and an impedance matching circuit to an antenna.

The directional coupler allows for the detection of a forward voltage and a reflected voltage, which are combined through quadrature multiplication to give an error signal used to adjust impedance matching. The error signal is directly related to the detected impedance mismatch.

An example of a tuning system in the prior art is described in U.S. Pat. No. 4,493,112 to Bruene which shows a circuit that performs quadrature multiplication of a forward voltage and a reflected voltage sampled from a directional coupler to produce an error signal. The product error signal is applied to an impedance matching circuit to tune the circuit.

The error signal, which is a direct current (d.c.) signal, is produced as a result of the quadrature multiplication and is produced only when the forward and reflected signals, which are multiplied, have components of like frequency, i.e., multiplication of voltages of unlike frequency does not produce a d.c. output signal. Thus, the magnitude of the error signal will be proportional to the sum of the products of the individual voltage components which are of like frequency.

The quadrature multiplication process involves the application of a signal to a first multiplier and a 90° phase shifted version of the same signal to a second multiplier. Use of the output signals from both of the multipliers insures that the error signal will not be zero due to multiplication of signals that are 90° out of phase.

The operational assumption which underlies the prior art is that the magnitude of the error signal is directly proportional to the magnitude of the reflected voltage which in turn corresponds to the degree of impedance mismatch. Because the forward voltage is assumed to contain only signals of the desired frequency, a reduction of the error signal corresponds with a reduction in the reflected voltage, which indicates the degree of impedance matching. Accordingly, impedance matching is enhanced when the error signal is reduced.

However, prior art systems such as the one described in the Bruene patent are disadvantaged by this assumption in that the forward voltage may contain significant components attributable to externally generated RF signal. In actual operation, the forward voltage is made up of several components. Some of the forward voltage components are attributable to the communications signal as assumed. The forward voltage components attributable to the communications signal include attenuated reflections of the forward voltage which occur due to impedance mismatch. These twice reflected components are related to the communications signal and generally have the same frequency as the communications signal.

In addition, there may be significant other components in the forward voltage attributable to signals coming into the system through the antenna from external sources (externally generated RF signals), and to reflections of them in the forward voltage. It is assumed that the components of the forward voltage from external sources have frequencies other than that of the communications signal.

Accordingly, quadrature multiplication of the forward and reflected voltages produces a d.c. output or error signal which is related in part to interference at the desired communications signal frequency and in part to interference from externally generated RF signals not at the desired frequency. Thus there is an undesired d.c. component in the error signal, and tuning to reduce impedance mismatch at the communications signal frequency using an error signal not entirely related to such mismatch is not optimum. The tuning of the impedance matching circuit may further be disadvantaged by the uncontrollable timing and magnitude of the occurrence of externally generated signals, leading to undesirable hunting by the impedance matching circuit.

Embodiments of the present invention improve upon known systems by detecting impedance mismatch in the presence of externally generated RF signals not at the frequency of the communications signal. Impedance mismatch is detected in such a way that the influence of the externally generated RF signals on the error signal is reduced.

One embodiment of the present invention performs quadrature multiplication using a voltage related to the carrier signal (which only has components with the frequency of the desired communications signal) in contrast to the forward voltage (which has components from external sources).

In effect, the use of the carrier signal voltage in the quadrature multiplication enables the detection of impedance mismatch attributable only to interference at the frequency of the communications signal in the presence of externally generated RF signals. Because the carrier signal does not have components attributable to external signals, there will be no d.c. error signal component produced by the quadrature multiplication that corresponds to the external signals. Accordingly, impedance matching that is carried out in response to the error signal produced using the carrier signal, will not be thrown off by error signal components that do not relate to impedance mismatch at the desired communications frequency.

Another embodiment of the invention permits the use of the directional coupler forward voltage, but only after attenuating the signals attributable to external sources present in the forward voltage. The attenuation of externally generated RF signals in the forward voltage, before quadrature multiplication, yields an error signal with a smaller component attributable to the external signals in comparison to the use of forward voltages without attenuation.

It is accordingly an object of the present invention to provide a novel circuit and method of detecting impedance mismatch between a source and an antenna in the presence of external source signals.

It is another object of the present invention to provide a novel circuit and method of detecting impedance mismatch so that the error signal produced by quadrature multiplication is almost exclusively related to the reflected communications signal.

It is also an object of the present invention to provide a novel circuit and method of detecting impedance mismatch so that impedance matching circuit tuning is substantially non-responsive to signals from external sources.

DESCRIPTION OF PREFERRED EMBODIMENTS

Figure 1:
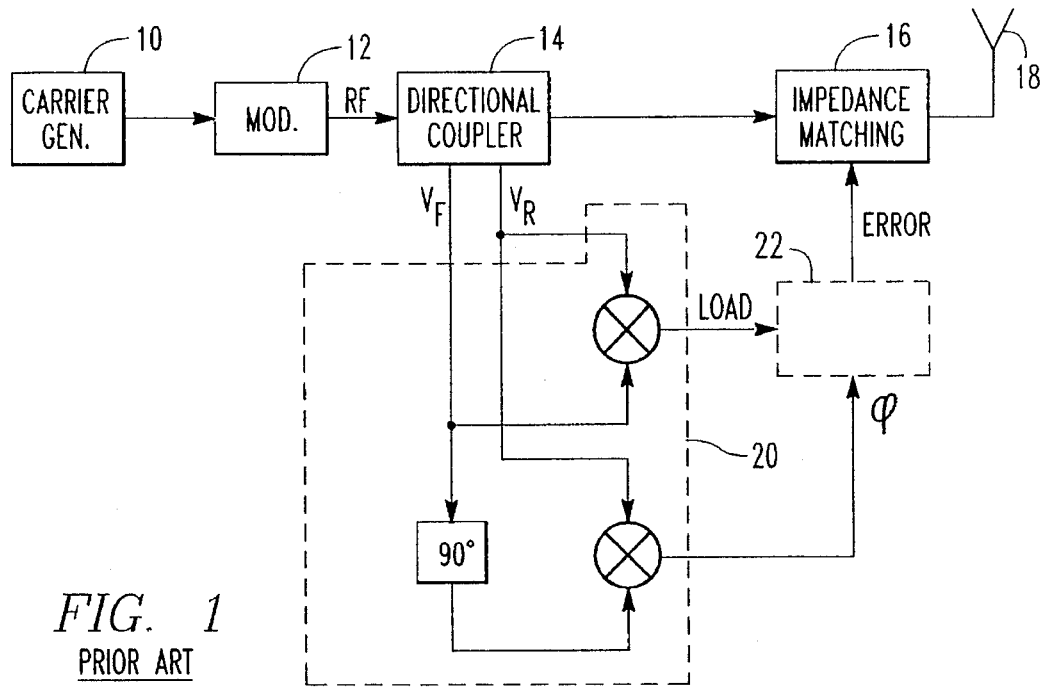
FIG. 1 is a functional block diagram of a prior art communications system.

As shown in FIG. 1, a known communications system typically includes a carrier signal generator or exciter 10, a modulator 12, a directional coupler 14, an impedance matching circuit 16 and an antenna 18. Detection of an impedance mismatch is achieved by the quadrature multiplication of the forward voltage $V_F$ and the reflected voltage $V_R$ as detected at the quadrature multiplier 20. Tuning of the impedance matching circuit 16 to reduce the reflections of the communication signal by the antenna 18 can be accomplished by any suitable conventional means. For example, the error signal from the processing circuit 22 is applied to the impedance matching circuit 16 and the impedance matching circuit may then be adjusted in a conventional manner to reduce the error signal.

A preferred embodiment of the invention contemplates the use of a voltage related to the system carrier signal CARRIER in lieu of the forward voltage $V_F$ for quadrature multiplication. Since the frequency of the CARRIER signal is the same as the frequency of the desired communications signal, quadrature multiplication will produce an error signal which is related solely to reflected impedance mismatch signals at the frequency of the desired communications signal.

Figure 2:
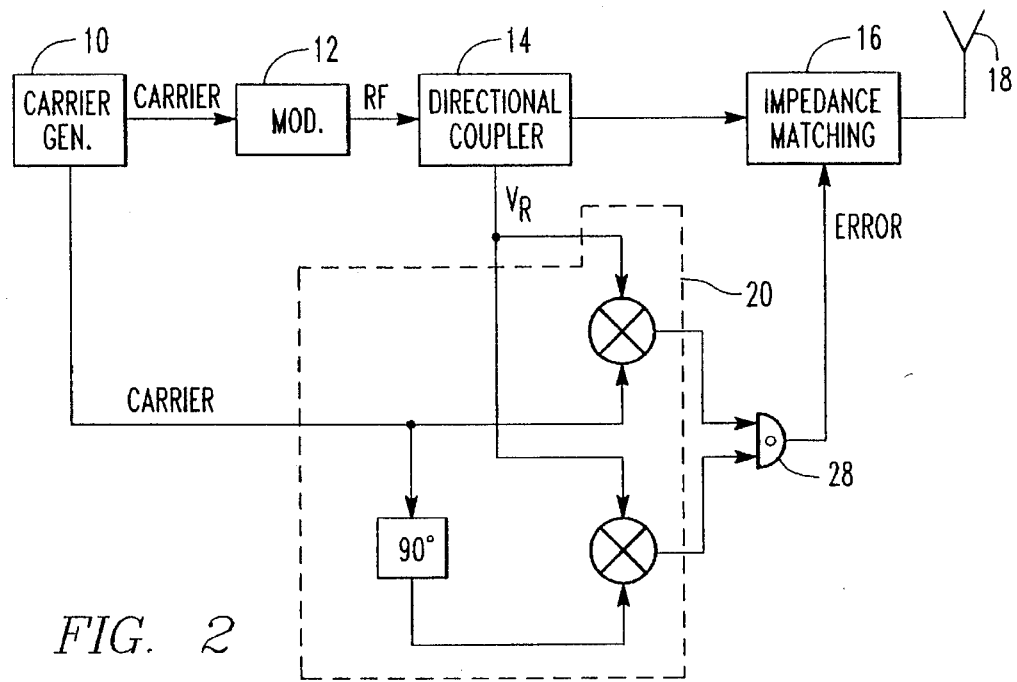
FIG. 2 is a representation of one embodiment of the communications system of the present invention.

As shown in FIG. 2 where like numerical reference numerals have been used for like elements to facilitate an understanding of the invention, the communications system includes a carrier generator 10 which generates the CARRIER signal which is applied through a modulator 12 to produce an RF signal which is passed through a directional coupler 14 and an impedance matching circuit 16 to an antenna 18.

In the preferred embodiment of the invention, the CARRIER signal is also applied to a quadrature multiplier 20. The output signals from the quadrature multiplier 20 are applied to an OR gate 28. The output signal from the OR gate 28 is the ERROR signal which is applied to the impedance matching circuit 16 to adjust the impedance matching circuit 16 in a conventional manner to reduce the ERROR signal.

The use of the CARRIER signal for quadrature multiplication provides an advantage because the ERROR signal (or detected impedance mismatch) will not have any components attributable to externally generated signals.

In another but less desirable embodiment of the invention, the component of the directional coupler forward voltage attributable to external signals is attenuated in order to provide an improved forward voltage for use in deriving an error signal through quadrature multiplication.

Figure 3:
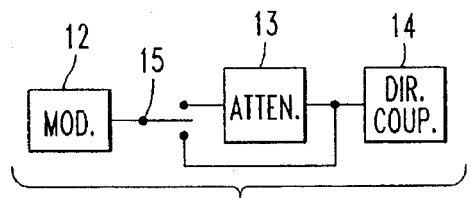
FIG. 3 is a block diagram showing a modification of the communications system of the present invention shown in FIG. 2.

With reference to FIG. 3, in the less desirable embodiment of the invention attenuation of the externally generated RF signals present in the forward voltage of the circuit of FIG. 2 may be attained by passing the signals travelling between the modulator 12 and the directional coupler 14 through an attenuator 13. A switch 15 may be provided so that the attenuator may be taken out of the circuit when so desired.

Use of the attenuator causes the externally generated signals travelling in the forward direction to the directional coupler to be attenuated more relative to the communications signal. This occurs because the communications signal is attenuated only once as it passes through the attenuator 13 in the forward direction to reach the directional coupler forward port. In contrast, the externally generated signals must pass through the attenuator 13 twice to reach the directional coupler forward port, once in the reverse direction and then again in the forward direction.

The above embodiments of the present invention are beneficial in that they provide for faster and more accurate tuning of the impedance matching circuit in the presence of externally generated RF signals.

The present invention may, of course, be embodied in other specific forms without departing from the spirit or essential characteristics thereof. The presently disclosed embodiments are therefore to be considered in all respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A method for detecting an impedance mismatch between a directional coupler and an antenna of an RF communications system operating at a first frequency in which the antenna is exposed to an externally generated RF signal of a different frequency comprising the quadrature multiplication of (i) a first signal in which any components related to the externally generated RF signals are substantially reduced relative to the components related to externally generated RF signals present in the signal passed through said directional coupler in the forward direction and (ii) a second signal related to a signal passing through the directional coupler in the reverse direction to generate an error signal representative of such impedance mismatch.

2. The method of claim 1 wherein the first signal is the carrier signal of the first signal having essentially no components related to externally generated RF signals.

3. The method of claim 1 wherein the first signal includes an attenuated RF communications signal and twice attenuated components related to externally generated RF signals.

4. The method of claim 1 including the further step of tuning an impedance matching circuit operationally connected between the directional coupler and the antenna to minimize the error signal.

5. In an RF communications system including means for providing an RF carrier signal, a modulator, a directional coupler, an impedance matching circuit and an antenna exposed to externally generated interference signal at a frequency other than that of a desired communications signal, means for reducing the influence of the interference signal on the detection of an impedance mismatch between the directional coupler and the antenna comprising:

means for detecting a signal which passes through the directional coupler in the reverse direction;

means for quadrature multiplying the detected signal with a forward signal having frequency components substantially limited to that of the desired communications signal to provide an error signal related to said impedance mismatch.

6. The RF communications system of claim 5 including means for providing said carrier signal to said quadrature multiplying means as said forward signal.

7. The RF communications system of claim 5 including:

an attenuator operatively coupled between said modulator and said directional coupler; and means for applying the output signal from said attenuator to said quadrature multiplying means as said forward signal.

8. The RF communications system of claim 5 including means for tuning said impedance matching circuit in response to said error signal.

* * * * *